United States Patent [19]

Klason et al.

[11] Patent Number: 5,726,106

[45] Date of Patent: Mar. 10, 1998

[54] EMI SHIELDING MATERIALS, FIBERS THEREFOR AND METHOD FOR THEIR PREPARATION

[76] Inventors: Tore Carl Fredrik Klason, Hjälmared 2201, S-441 95, Alingsås, Sweden; Josef Kubat, Vintervägen 14, S-171 34, Solna, Sweden; Anatoliy Tikhonovich Ponomarenko, D. Ulyanova Street, 3, Apt. 114, Moscow, Russian Federation, 117333; Aleksei Vladimirovich Buts, Nemchinovka-1, Michurin Street, 17, Apt. 115, Moscow Region, Russian Federation, 143013; Elena Sergeevna Grinenko, Reutov, Novogireeskaya Street, 8, Apt. 20, Moscow Region, Russian Federation, 143952; Igor Nikolaevich Ponomarev, Orekhovo-Zuev Pr., 8, Apt. 12, Moscow, Russian Federation, 109341; Vitaliy Georgievich Shevchenko, Orekhovy Boulevard, 51, Apt. 296, Moscow, Russian Federation, 115580

[21] Appl. No.: 702,630
[22] PCT Filed: Mar. 3, 1995
[86] PCT No.: PCT/SE95/00229
    § 371 Date: Nov. 12, 1996
    § 102(e) Date: Nov. 12, 1996
[87] PCT Pub. No.: WO95/23884
    PCT Pub. Date: Sep. 8, 1995

[30] Foreign Application Priority Data

Mar. 3, 1994 [SE] Sweden .................. 9400735

[51] Int. Cl.$^6$ ........................................ B32B 27/02
[52] U.S. Cl. ................ 442/365; 264/104; 264/126; 442/401
[58] Field of Search .................. 264/104, 126, 264/172.13, 172.16; 442/365, 401; 428/365

[56] References Cited

U.S. PATENT DOCUMENTS

| 4,699,743 | 10/1987 | Nakamura et al. | 264/104 |
| 4,725,490 | 2/1988 | Goldberg | 442/365 |

Primary Examiner—Mary Lynn Theisen
Attorney, Agent, or Firm—Browdy and Neimark

[57] ABSTRACT

EMI shielding materials in form of plates, panels, and fabrics and methods for their preparation and for preparing highly filled ferromagnetic fibers therefore are described. In the method the ferromagnetic filler is treated in an ultrasonic dispenser or a ball mill in the presence of a binder polymer and then the fiber is made by wet spinning from a dispersion containing solution or gel of the polymer.

10 Claims, No Drawings

EMI SHIELDING MATERIALS, FIBERS THEREFOR AND METHOD FOR THEIR PREPARATION

The present invention relates to EMI shielding materials in form of plates, panels, and fabrics and methods for their preparation and for preparing the fibers therefor.

BACKGROUND ART

The harmful action of high intensity, high frequency electromagnetic radiation on sensitive micro electronics and especially on human body has been recognized for a long time. For shielding the source of radiation different absorbing or reflecting panels, blocks or plates are used. If the source cannot be completely shielded for protection of personnel different clothes made of fabrics with metallic or metallized fibers have been used. However, such materials are of reflecting type, i.e. are themselves secondary sources of radiation with uncontrollable power and directional pattern. The secondary radiation fields can irradiate unprotected parts of human body and penetrate areas that are closed to the direct action of primary fields.

Thus, for effective protection of personnel from electromagnetic radiation, elastic fabrics or textile materials of the absorbing type are required. Such fabrics can be produced from synthetic chemical fibers filled with particles of absorbing material.

The known method of production of fibers with magnetic particles comprise extrusion, which does not allow high concentration of absorbing component owing to the high viscosity of the resulting melt. According to another known method fibers are made by spinning from paste mixture of polymer and magnetic particles but the resulting fiber has a structure of shell-core type, with magnetic particles present either in the shell or the core, which reduces the effective filler concentration.

A known method for production of fabrics uses permanent magnet as a filler. However, said filler has very low absorption of electromagnetic waves, which makes fabrics made from fibers with this filler unsuitable for EMI shielding.

According to a known method for making EMI shielding panels, short thermoplastic fibers are mixed with conducting nonwoven material and the mixture is then pressure molded. However, this method does not provide uniform filler distribution in the material at high concentration which drastically reduces its effectiveness as EMI shielding material.

DISCLOSURE OF THE INVENTION

An object according to the present invention is to provide a method for production of highly filled ferromagnetic fibers.

Another object according to the present invention is to produce EMI shielding materials in form of panels and plates and fabrics manufactured by means of highly filled ferromagnetic fibers.

According to the present invention highly filled ferromagnetic fibers are made by wet spinning from dispersion containing a solution or gel of polymer and particles of ferromagnetic fillers. Components of said dispersion are treated in an ultrasonic dispenser or ball mill and the diameter of said fibers is 20–30 average diameter of the filler particles.

Effective absorber particles useful as fillers in the making of the highly loaded ferromagnetic fibers according to the present invention are e.g. carbonyl iron and magnetically soft ferrites. The filler particles are first treated either in an ultrasonic dispenser with a small amount of solvent added and in the presence of a small amount, e.g. 1 wt. % of binder polymer or in a ball mill. The particles of carbonyl iron are not changed by the treatment and remain in form of practically monodispersed particles of 2–5 µm diameter. The ferrite particles are partially reduced in size during the treatment and a wide particle size distribution results with the fine fraction ($d<0.1d_{av}$) being at least 10 wt. %.

Treatment of the filler in the presence of a small amount of binder polymer ensures high stability of dispersion through the mechanism of displacement stabilization even for high density fillers during the whole period of fiber spinning.

As a binder thermoplastic polymers are used, such as copolymers of tetrafluoroethylene, superhigh molecular weight polyethylene, etc.

The diameter of the fibers can be controlled by the use of an appropriate spinneret so that it is in the range of 20–30 average diameters of the filler particles. At low fiber diameter effective loading is reduced owing to scale factor the tensile strength also being reduced owing to appearance of defects around larger particles. At higher fiber diameters the absorption is reduced owing to increased demagnetizing factor and the influence of skin-effect, i.e. ejection of electromagnetic field from the inner part of the fiber.

The ferromagnetic fabrics according to the present invention are made by twisting the ferromagnetic fibres prepared by the method according to the present invention, if desired, by twisting fibers containing different fillers. Thus, in order to increase the effective range of absorbed electromagnetic waves a complex filament is used to make the fabric, e.g. 1 iron fiber+1 ferrite fiber or 2 iron fibers+1 ferrite fiber etc. The filament can also include electrically conducting fibers having a conductivity in the range of 0.01 to 1 $(Ohm.cm)^{-1}$. Thus, in this way fabrics of different textures can be obtained with different fillers. Since operating ranges of carbonyl iron and ferrite are different the fabrics are often made of filaments containing various combinations of twisted fibers with different fillers (1+1, 1+2 or 2+1, etc.) in order to widen the operating range of the fabrics.

EMI shielding panels and plates according to the present invention with a high concentration of absorbing material with its particles uniformly disposed in the bulk of the product are made by cutting the ferromagnetic fibers prepared by the method according to the present invention to a length of 10–100 diameters of fiber and, if desired, fibers containing different fillers are mixed together, then placed in a mold and pressure molded at a temperature exceeding the melting temperature of the binder polymer.

In order to increase the rigidity and strength of the plates or panels cut fibers are placed between two films of a thermoplastic polymer and this laminate is then pressure molded at a temperature of between 130° C. and 160° C., preferably between 140° C. and 150° C.

In the method according to the present invention the highly filled fibers are made by wet spinning from dispersion, containing a solution or a gel of a polymer with the ferromagnetic filler particles. After the fibers have passed through the spinneret solvent is removed in a precipitation bath in case of a solution or by substitution with a more volatile solvent and subsequent drying in the case of a gel. In the latter case the fibers are subjected to orientation drawing and subsequent thermofixation at elevated temperatures.

The invention is illustrated by means of the following examples which however are not intended to limit the invention in any way.

EXAMPLE 1

Polycrystalline hexaferrite is charged to an ultrasonic dispenser, then 10 ml of acetone and 1 wt. % of a binder polymer are added. The binder polymer is a copolymer of tetrafluoroethylene and vinylidenefluoride in the ratio 1:2 and with a number average molecular weight of $2.16 \times 10^5$. The mixture is treated for 15 minutes at the frequency 250 kc/s and power 50 W. The paste is mixed with polymer solution in acetone of 13–14 wt. % concentration. The filler concentration in dispersion is 60–90 wt. % with respect to disolved polymer. Fibres are then made by wet spinning through a spinneret with a hole diameter of 900 µm. After passing a precipitation bath (5% acetone solution in water) the fiber diameter is 20–30 average diameters of the filler particles, depending on drawing ratio. The ferrite fiber with 77 vol. % loading has a tensile strength of 3 MPa, a magnetic permittivity at 4.8 GHz $\mu^* = 2.1-2.0i$ and dielectric permittivity $\epsilon^* = 8.0-0.25i$.

EXAMPLE 2

Powders of carbonyl iron and polyethylene with a molecular weight of $2.5 \times 10^6$ are mixed in a ball mill for 60 min (70–90 vol. % of iron with respect to polymer), then liquid paraffin is added (90 vol. % with respect to polymer) and the mixture is heated at 180° C. for 1 hour. The gel-fibers are made by forcing the solution through a 1 mm capillary. Fiber diameter is 20–30 average diameters of filler particles. If necessary paraffin can be extracted by pentane. Fiber with 80 vol. % loading has a tensile strength of 13 MPa, a magnetic permittivity at 4.8 GHz $\mu^* = 2.82-2.49i$ and a dielectric permittivity $\epsilon^* = 20.7-1.09i$.

EXAMPLE 3

Carbonyl iron and superhigh molecular weight polyethylene (molecular weight $4 \times 10^6$) powders are mixed in a ball mill for 60 min (70–90 vol. % of iron with respect to polymer), the solvent is added (90 vol. % with respect to polymer) and the mixture is heated at 180° C. for 1 hour. The gel-fibers are made by forcing the mixture through a 100 µm capillary. The fibers are then subjected to orientation drawing at 110° C. and rate 300 mm/min. The drawing ratio is 1800%. The solvent is then extracted by hexane and fibers are subjected to thermofixation in a strained state at 130° C. Fiber with 90 vol. % loading has a tensile strength of 44.2 MPa, a tensile modulus of 445 MPa and an elongation at break of 10%, a magnetic permittivity at 4.8 GHz $\mu^* = 2.82-2.49i$ and a dielectric permittivity $\epsilon^* = 20.7-1.09i$.

EXAMPLE 4

Ferrite fibers with 70 vol. % loading are cut to a length of 50 fiber diameters, uniformly distributed on 0.15 mm thick polyethylene film, covered on top with the same film and pressure molded at 140° C. and 100 MPa. The resulting laminated plate is 1 mm thick and has an electromagnetic wave absorption of 30 dB/cm in the frequency range 6–12 GHz.

EXAMPLE 5

A fabric made of fibers, filled with carbonyl iron at 70 vol. % loading has an electromagnetic wave absorption of 18 dB/cm in the frequency range 6–12 GHz. A fabric made of complex filament (fiber with carbonyl iron at 70 vol. % loading+fiber with ferrite at 80 vol. % loading) has an absorption of 25 dB/cm in the frequency range 2–12 GHz.

As seen from the above examples the method according to the invention allows the making Of strong highly filled fibers with ferromagnetic properties and the making of ferromagnetic fabrics and EMI shielding panels from these fibers.

We claim:

1. A method for producing highly filled ferromagnetic fibers in which the ferromagnetic filler is treated in an ultrasonic dispenser or a ball mill in the presence of a binder polymer and then the fiber is made by wet spinning from a dispersion containing solution or gel of said polymer through a spinneret so that a fiber of a diameter of 20–30 average diameters of the filler particles is obtained.

2. A method according to claim 1, in which said binder polymer is a copolymer of tetrafluoroethylene and vinylidenefluoride in the ratio of 1:2 and a number average molecular weight of from $1 \times 10^5$ to $5 \times 10^5$ and the solvent is acetone or dimethylformamide.

3. A method according to claim 1, in which said binder polymer is polyethylene with a number average molecular weight of from $1 \times 10^6$ to $4 \times 10^6$ and the solvent is liquid paraffin.

4. A method according to claim 3, in which said solvent is extracted from the fibers by pentane or hexane and the fibers are subjected to orientation drawing and subsequent thermofixation in oriented state.

5. A method according to claim 1, in which the filler is carbonyl iron or polycrystalline hexaferrite.

6. An EMI shielding material comprising short fibers highly loaded with absorbing ferromagnetic particles uniformly dispersed in the bulk of the product wherein the fibers have a diameter of 20–30 average diameters of the filler particles.

7. An EMI shielding material according to claim 6, in form of a fabric of highly loaded wet spun ferromagnetic fibers twisted into filaments.

8. A method for producing in the form of a panel an EMI shielding material in which short fibers highly loaded with absorbing ferromagnetic particles are uniformly dispersed in the bulk of the product, wherein the fibers have a diameter of 20–30 average diameters of the filler particles, comprising:

cutting fibers prepared according to the method of claim 1 to a length of 10–100 diameters of the fiber;

placing said cut fibers in a mold; and pressure molding at a temperature which exceeds the melting temperature of the binder polymer.

9. A method for producing an EMI shielding material in the form of a fabric of highly loaded wet spun ferromagnetic fibers twisted into filaments, in which short fibers highly loaded with absorbing ferromagnetic particles are uniformly dispersed in the bulk of the product, wherein the fibers have a diameter of 20–30 average diameters of the fiber particles, comprising twisting fibers prepared in accordance with the method of claim 5 into a filament at the ratio of ferrite and iron fibers of 3:1, 2:1, 1:1, 0:1, 1:0, 1:2 or 1:3.

10. A method according to claim 9, in which into said filament is additionally twisted an electrically conducting fiber with a conductivity of $0.01-1$ $(Ohm.cm)^{-1}$.

* * * * *